(12) United States Patent
Bergan et al.

(10) Patent No.: US 7,030,636 B1
(45) Date of Patent: Apr. 18, 2006

(54) LOW PIN TESTING SYSTEM

(75) Inventors: Ronald O. Bergan, Fargo, ND (US); Lee R. Bahls, West Fargo, ND (US)

(73) Assignee: Fargo Assembly Company, Fargo, ND (US)

( * ) Notice: Subject to any disclaimer, the term of this patent is extended or adjusted under 35 U.S.C. 154(b) by 0 days.

(21) Appl. No.: 11/120,126

(22) Filed: May 2, 2005

(51) Int. Cl.
*G01R 31/02* (2006.01)

(52) U.S. Cl. .................. 324/761; 324/756; 324/758

(58) Field of Classification Search ............ None
See application file for complete search history.

(56) References Cited

U.S. PATENT DOCUMENTS

| | | | |
|---|---|---|---|
| 3,312,460 A | 4/1967 | Kaufman ................. 269/70 |
| 4,405,233 A * | 9/1983 | Grau ................. 356/237.1 |
| 4,800,335 A | 1/1989 | Davila et al. ............. 324/158 |
| 4,849,743 A | 7/1989 | Ohno .................... 340/687 |
| 4,992,739 A | 2/1991 | Kosch ................... 324/540 |
| 5,097,213 A | 3/1992 | Hunting et al. ......... 324/538 |
| 5,455,515 A | 10/1995 | Saijo et al. ............. 324/538 |
| 5,572,139 A | 11/1996 | Kelley .................. 324/538 |
| 5,604,440 A | 2/1997 | Tomikawa et al. ....... 324/539 |
| 5,663,655 A | 9/1997 | Johnston et al. ........ 324/761 |
| 5,844,421 A | 12/1998 | Lee et al. ............... 324/758 |
| 6,081,124 A | 6/2000 | Chiyoda ................. 324/538 |
| 6,218,849 B1 | 4/2001 | Kiyokawa .............. 324/755 |
| 6,225,817 B1 | 5/2001 | Sayre et al. ............. 324/754 |
| 6,305,230 B1 | 10/2001 | Kasukabe et al. ......... 73/855 |
| 6,498,506 B1 | 12/2002 | Beckous ................. 324/761 |
| 6,541,992 B1 | 4/2003 | Wei et al. ............... 324/761 |
| 2003/0126735 A1 | 7/2003 | Taniguchi et al. ......... 29/593 |

OTHER PUBLICATIONS

Electrical Continuity & Components Fixture Blocks www.eccco.com Website Printout, date unknown, 1 Page.
Electrical Continuity & Components Sample Images www.eccco.com Website Printout, date unknown, 2 Pages.

* cited by examiner

*Primary Examiner*—Minh N. Tang
(74) *Attorney, Agent, or Firm*—Michael S. Neustel (57) ABSTRACT

A low pin testing system for efficiently detecting unlocked terminals within an electrical connector. The low pin testing system includes a housing with a receiver opening for removably receiving an electrical connector to be tested, a plurality of probe passages within the housing, a plurality of testing probes slidably positioned within the housing in a biased manner each having an engaging end extending into said receiver opening and corresponding to a terminal within the electrical connector, a plurality of light emitters for illuminating light through corresponding light passages, and a plurality of light receivers at the opposite end of the light passages. The light passages extend substantially transverse through a row of the probe passages and the testing probes each include a cutout that allows the light to pass through the testing probes when the testing probes are moved from engagement with the terminals of an electrical connector.

33 Claims, 13 Drawing Sheets

LOW PIN TESTING SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to low pin testing devices and more specifically it relates to a low pin testing system for efficiently detecting unlocked terminals within an electrical connector.

2. Description of the Related Art

When manufacturing a wire harness, it is important that there are no unlocked terminals (referred to as "low pins") within the electrical connectors. An unlocked terminal within an electrical connector may pass conventional continuity testing and may even work initially within the end application. However, an unlocked terminal will eventually move out of contact with its mate due to shipping, handling, vibration or other force. When an unlocked terminal moves out of contact with its mate, this not only causes a breakdown of the machinery that the connector is used within but also requires expensive and time consuming debugging to determine the cause of the problem.

While conventional continuity testers may be suitable for the particular purpose to which they address, they are not as suitable for efficiently detecting unlocked terminals within an electrical connector. Conventional continuity testers utilize electrical continuity to test for unlocked terminals which can result in unlocked terminals passing the continuity test and failing later in the end application.

In these respects, the low pin testing system according to the present invention substantially departs from the conventional concepts and designs of the prior art, and in so doing provides an apparatus primarily developed for the purpose of efficiently detecting unlocked terminals within an electrical connector.

BRIEF SUMMARY OF THE INVENTION

In view of the foregoing disadvantages inherent in the known types of low pin testers now present in the prior art, the present invention provides a new low pin testing system construction wherein the same can be utilized for efficiently detecting unlocked terminals within an electrical connector.

The general purpose of the present invention, which will be described subsequently in greater detail, is to provide a new low pin testing system that has many of the advantages of the low pin testers mentioned heretofore and many novel features that result in a new low pin testing system which is not anticipated, rendered obvious, suggested, or even implied by any of the prior art low pin testers, either alone or in any combination thereof.

To attain this, the present invention generally comprises a housing with a receiver opening for removably receiving an electrical connector to be tested, a plurality of probe passages within the housing, a plurality of testing probes slidably positioned within the housing in a biased manner each having an engaging end extending into said receiver opening and corresponding to a terminal within the electrical connector, a plurality of light emitters for illuminating light through corresponding light passages, and a plurality of light receivers at the opposite end of the light passages. The light passages extend substantially transverse through a row of the probe passages and the testing probes each include a cutout that allows the light to pass through the testing probes when the testing probes are moved from engagement with the terminals of an electrical connector.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a low pin testing system that will overcome the shortcomings of the prior art devices.

A second object is to provide a low pin testing system for efficiently and reliably detecting unlocked terminals within an electrical connector.

Another object is to provide a low pin testing system that provides a low cost alternative to micro switch probes for unlocked terminal testing.

An additional object is to provide a low pin testing system that may be utilized with various styles, models and types of connectors.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 13:
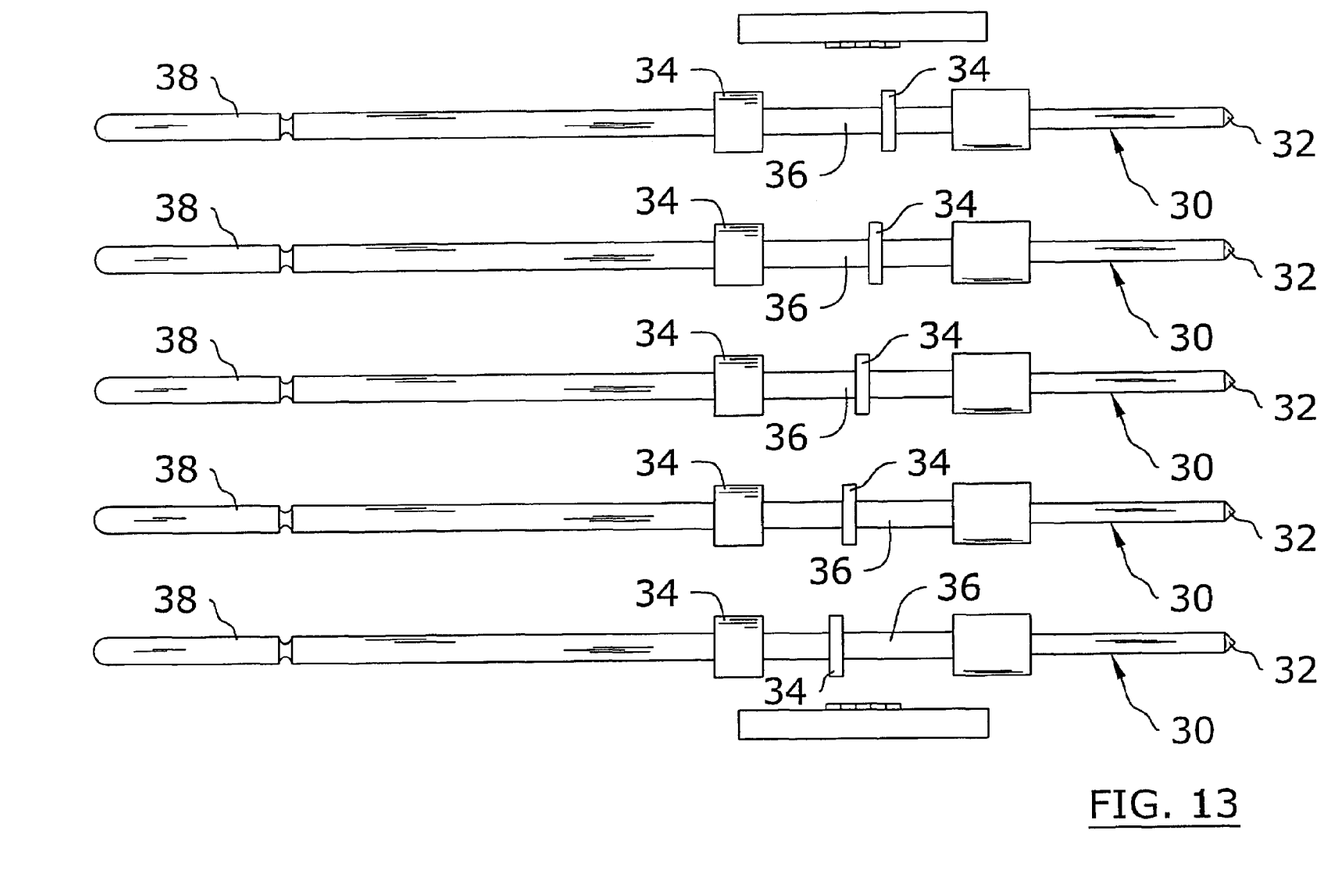
FIG. 13 illustrates an alternative embodiment of the present invention illustrating where the testing probes block the light when the terminals are properly seated within the connector.

Turning now descriptively to the drawings, in which similar reference characters denote similar elements throughout the several views, FIGS. 1 through 13 illustrate a low pin testing system 10, which comprises a housing 20 with a receiver opening 22 for removably receiving an electrical connector 12 to be tested, a plurality of probe passages 24 within the housing 20, a plurality of testing probes 30 slidably positioned within the housing 20 in a biased manner each having an engaging end 32 extending into said receiver opening 22 and corresponding to a terminal within the electrical connector 12, a plurality of light emitters 50 for illuminating light through corresponding light passages 26, and a plurality of light receivers 60 at the opposite end of the light passages 26. The light passages 26 extend substantially transverse through a row of the probe passages 24 and the testing probes 30 each include a cutout 36 that allows the light to pass through the testing probes 30 when the testing probes 30 are moved from engagement with the terminals 14 of an electrical connector 12. FIG. 13 illustrates an alternative embodiment of the present invention illustrating where the testing probes 30 block the light when the terminals 14 are properly seated within the connector 12.

B. Housing

Figure 1:
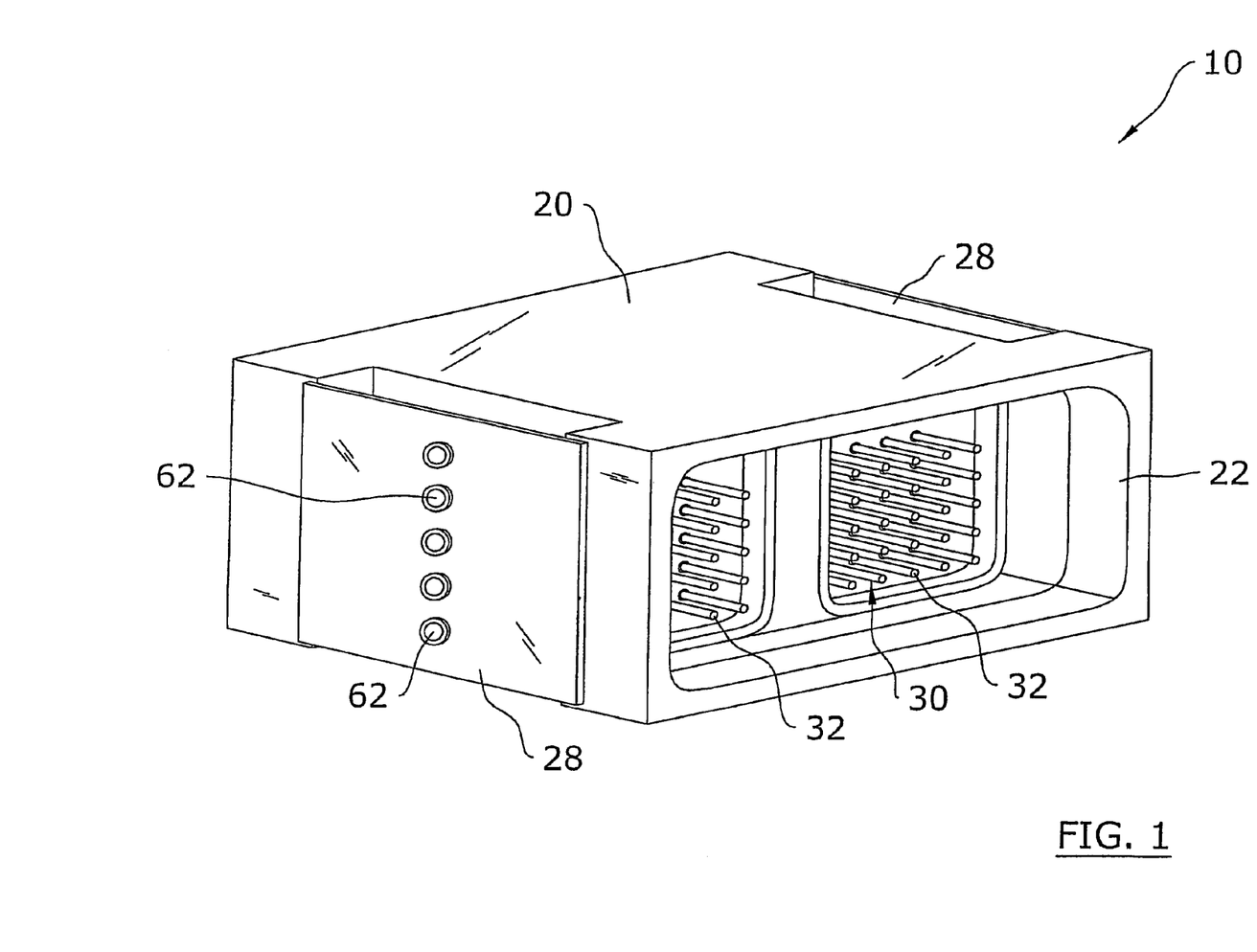
FIG. 1 is an upper perspective view of the present invention.

FIG. 1 illustrates an exemplary housing 20. The housing 20 may have various shapes, structures and configurations capable of being utilized within the present invention and can include structures not illustrated in the drawings.

Figure 2:
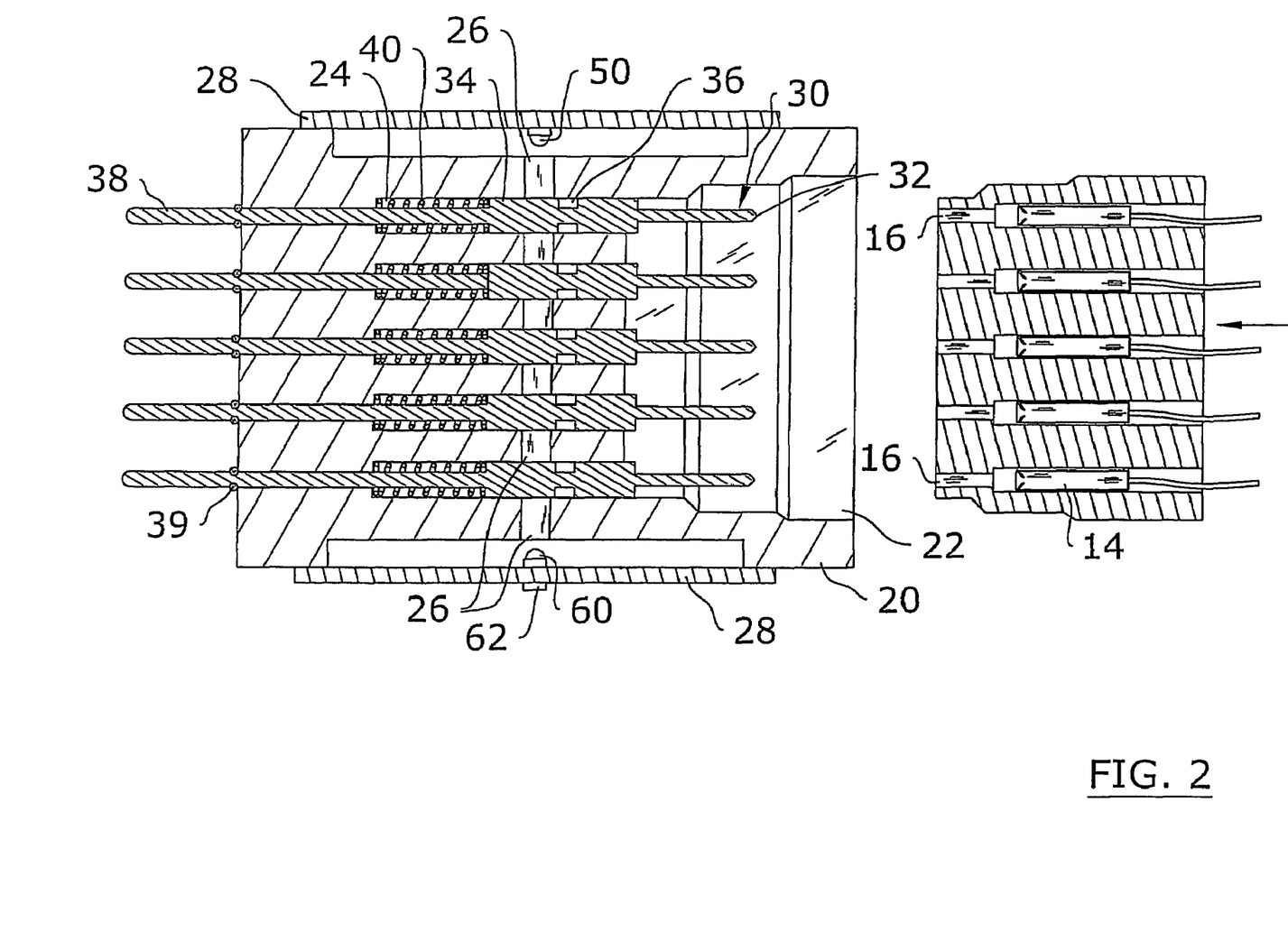
FIG. 2 is a top cutaway view of the present invention illustrating a plurality of testing probes positioned within the housing and a connector to be tested within the present invention.

The housing 20 includes at least one receiver opening 22 for removably receiving at least one electrical connector 12 with a plurality of terminals 14 to be tested as shown in FIGS. 1 and 2 of the drawings. It can be appreciated by one skilled in the art that a plurality of receiver openings 22 may be utilized within the present invention for testing a plurality of electrical connectors 12 at substantially the same time.

The plurality of probe passages 24 extend within the housing 20 and into the receiver opening 22 as shown in FIGS. 2, 3, 4 and 9 of the drawings. The probe passages 24 may have various cross sectional shapes. The probe passages 24 further may extend through a side of the housing 20 opposite of the receiver opening 22 for allowing an end portion 38 of the testing probes 30 to extend through as further shown in FIGS. 2, 3, 4 and 9 of the drawings.

The probe passages 24 are preferably substantially concentrically aligned with a plurality of terminals 14 of the electrical connector 12 to be tested. The probe passages 24 are further preferably aligned in one or more rows (e.g. vertical, horizontal or diagonal rows) according to the corresponding rows of the connector 12 to be tested.

Since there are numerous electrical connector 12 designs and configurations commercially available, the receiver opening 22 and the pattern of the probe passages 24 are accordingly modified to substantially mirror the same. The receiver opening 22 and the probe passages 24 illustrated in the drawings are for illustration purposes only and should not limit the scope or application of the present invention.

Figure 3:
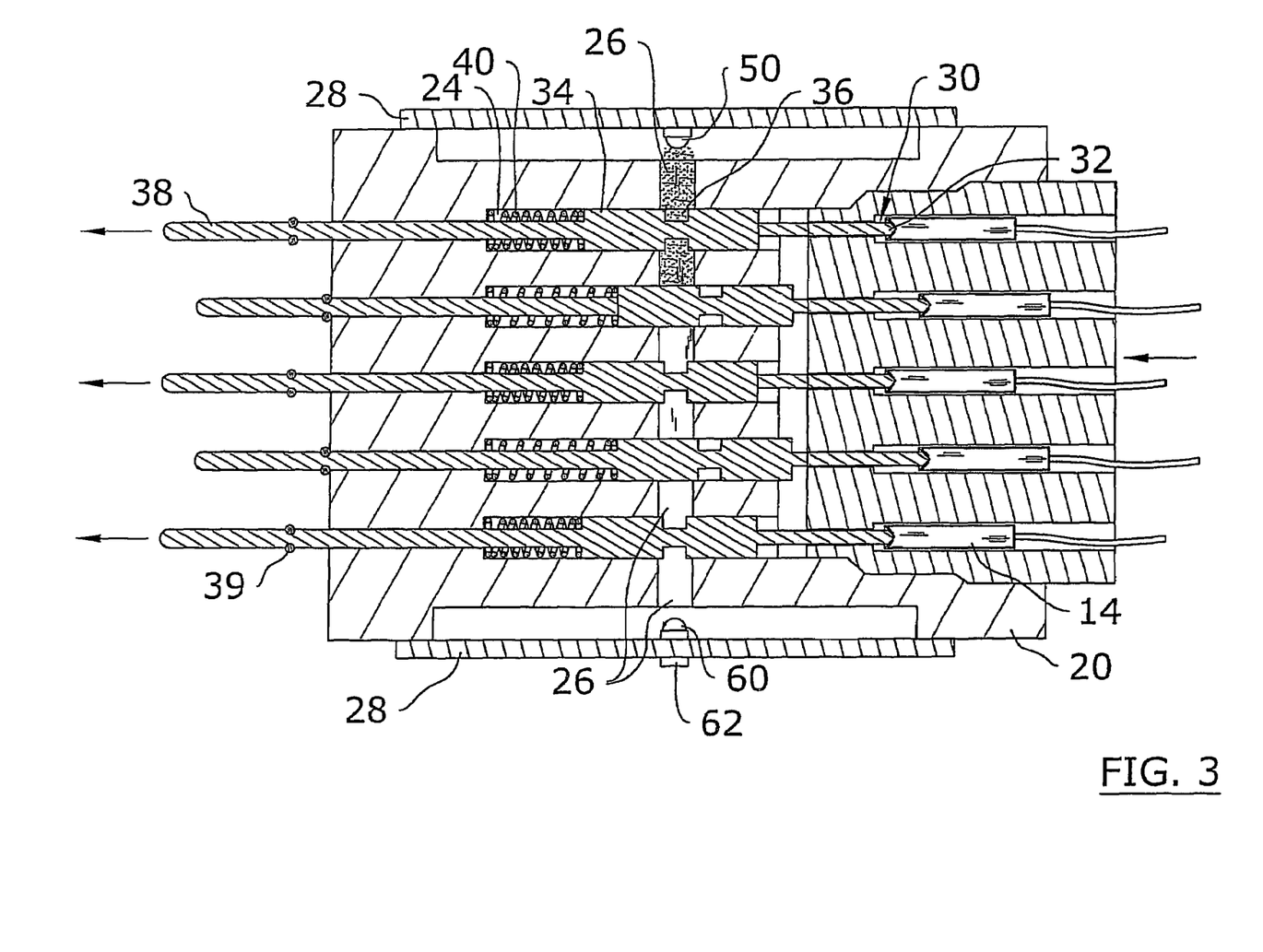
FIG. 3 is a top cutaway view of a connector positioned within the receiver opening of the housing with the testing probes engaging the terminals within the connector and illustrating that two terminals are in a low pin state.
Figure 4:
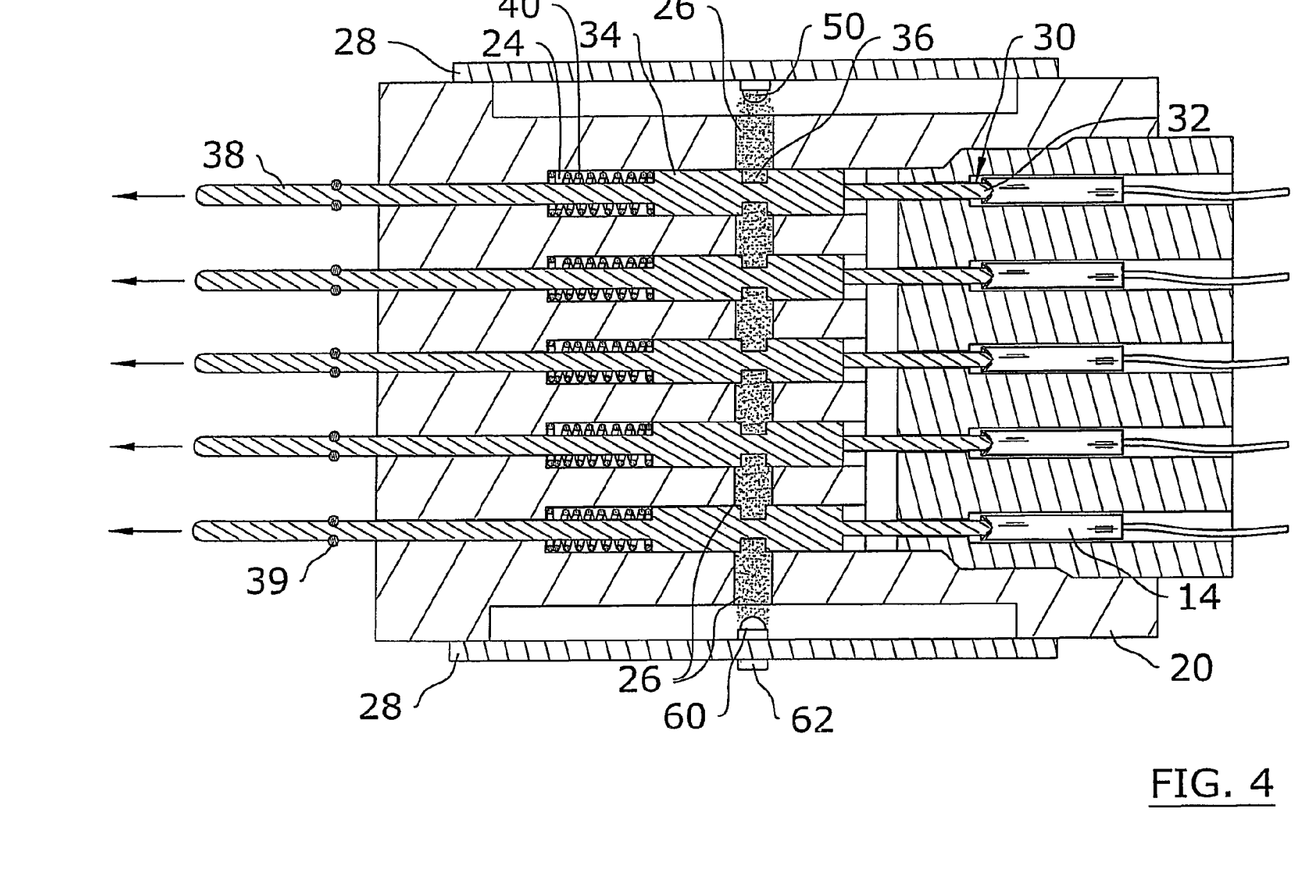
FIG. 4 is a top cutaway view of a connector positioned within the receiver opening of the housing with the testing probes engaging the terminals within the connector and illustrating that no terminals are in a low pin state.
Figure 5:
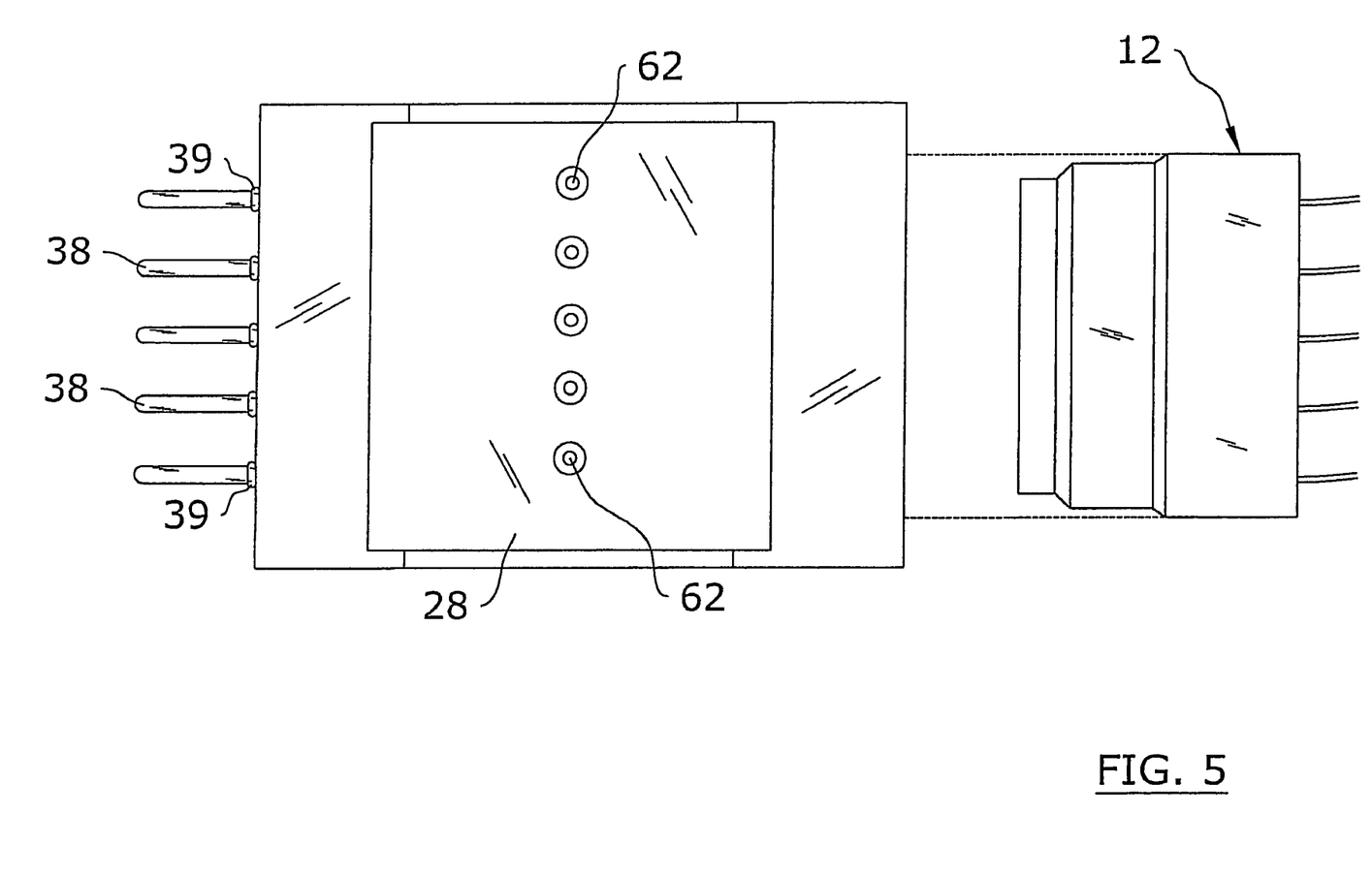
FIG. 5 is a side view of the present invention with a connector externally positioned.
Figure 6:
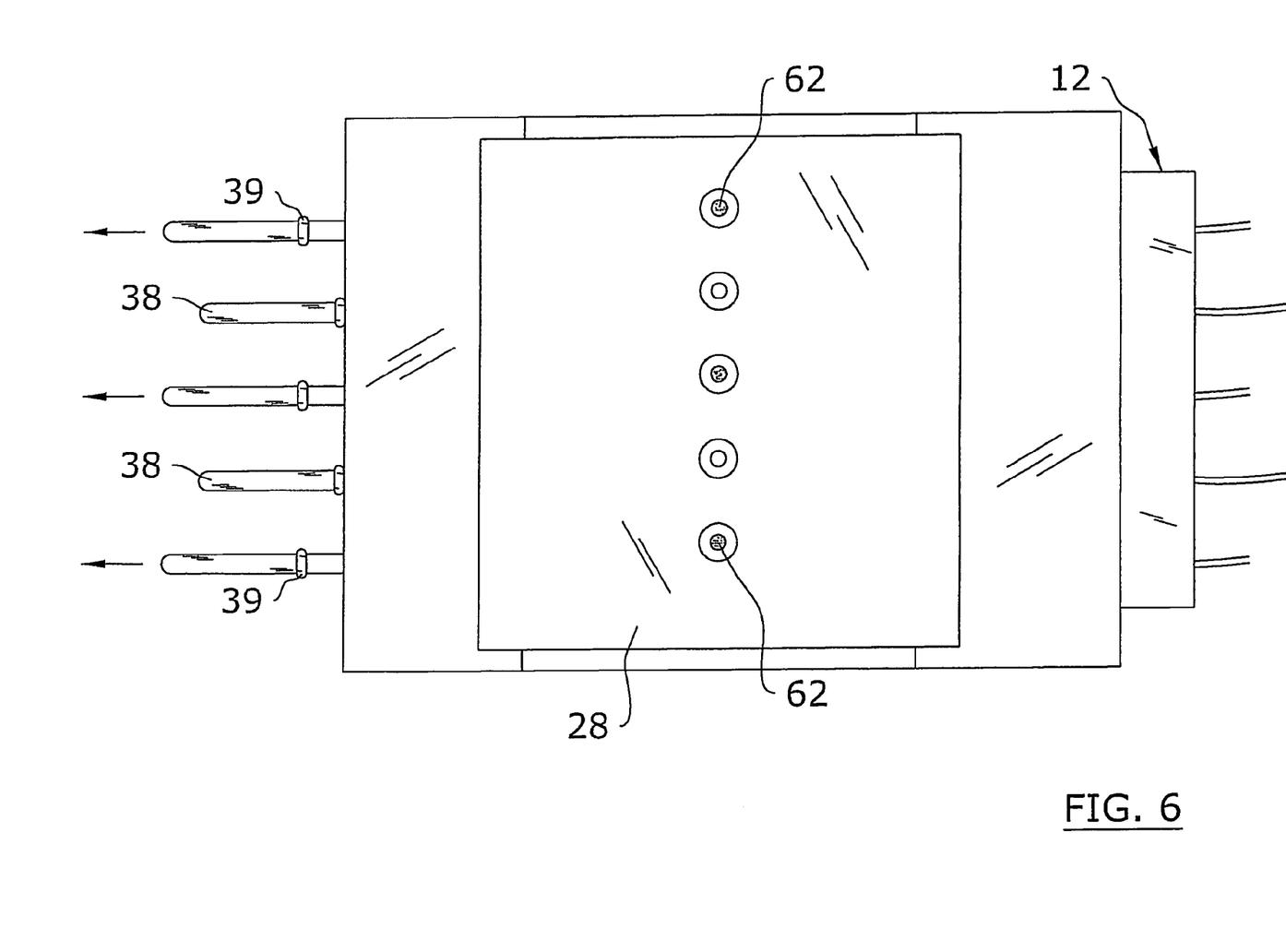
FIG. 6 is a side view of the present invention with the connector positioned within the receiver opening of the housing with two of the indicators not illuminated thereby indicating a low pin condition present within their respective terminal rows.

At least one light passage 26 extends within the housing 20 as shown in FIGS. 2, 3 and 4 of the drawings. The light passage 26 may extend completely through the housing 20 or only partially through the housing 20. Each light passage 26 preferably extends substantially transversely through the corresponding row of probe passages 24 as shown in FIGS. 3, 4 and 5 of the drawings.

Each light passage 26 allows for the passage of light from a corresponding light emitter 50 to a corresponding light receiver 60 to indicate that there are no "low pins" in the connector 12 being tested. Each light passage 26 corresponds to a row (e.g. vertical, horizontal or diagonal row) of the probe passages 24 as shown in FIGS. 2, 3 and 4 of the drawings. The light passage 26 preferably extends through the corresponding row of probe passages 24 as shown in FIGS. 2, 3, 4 and 9 of the drawings, however it is possible that the testing probes 30 may include extended portions that extend into the light passage 26 wherein the light passage 26 then does not pass through the probe passages 24.

C. Light Emitter

At least one light emitter 50 is attached to the housing 20 for providing light through each light passage 26. The light emitter 50 is positioned at one end of the corresponding light passage 26 as shown in FIGS. 2, 3, 4 and 9 of the drawings. The light emitter 50 may be comprised of any conventional light source (e.g. LED, light bulb).

D. Light Receiver

At least one light receiver 60 is attached to the housing 20 for detecting light from each light emitter 50 that passes through a corresponding light passage 26 as shown in FIGS. 2 through 4 of the drawings. The light receiver 60 may be comprised of any device capable of detecting the presence of an amount of light. The light receiver 60 is in communication with the control unit 70 for indicating to the control as to the presence of a "low pin" condition in the particular row of terminals 14 in the connector 12 being tested. The control unit 70 thereafter communicates with the display 72 to indicate to the user of a "low pin" condition present in the electrical connector 12.

The light receiver 60 may also include an indicator 62 for indicating detection of light from the at least one light emitter 50 as illustrated in FIGS. 2, 3 and 4 of the drawings. The indicator 62 is illuminated when light is detected (or alternatively, not detected) by the light receiver 60.

Alternatively, the light receiver 60 may be comprised of a simple lens (or an opening) structure that allows for the passage of light for allowing an individual to visually see the passage of the light through each of the light passages 26.

E. Testing Probes

As shown in FIGS. 2, 3, 4 and 9 of the drawings, a plurality of testing probes 30 are slidably positioned within the plurality of probe passages 24 within the housing 20. The testing probes 30 are biased towards the at least one receiver opening 22 by at least one bias member 40 as shown in FIGS. 2, 3, 4 and 9.

As shown in FIGS. 2, 3, 4 and 9, each of the testing probes 30 includes an engaging end 32 extending into the receiver opening 22 for selectively engaging a corresponding terminal within the electrical connector 12 being tested. The testing probes 30 are preferably comprised of an elongated straight structure as shown in FIGS. 2 through 4 of the drawings. The engaging end 32 of the testing probes 30 may be pointed for engaging the interior portion of the terminals 14 as shown in FIGS. 2, 3, 4 and 9 of the drawings. The end portion 38 of the testing probes 30 may include a cincture 39 or similar structure for limiting a forward movement of the testing probes 30 into the receiver opening 22.

The testing probes 30 each preferably include a body portion 34 positioned between the engaging end 32 and the end portion 38 as shown in FIGS. 2, 3, 4 and 9. At least one cutout 36 extends within the body portion 34 of each of the testing probes 30 as shown in FIGS. 2, 3, 4 and 9. The cutout 36 may have various sizes, shapes and configurations, however the cutout 36 must be designed to allow at least a portion of the light from the light emitter 50 to pass through the light passage 26 when the cutout 36 is positioned within the light passage 26. The cutout 36 is preferably comprised of a groove that substantially or completely surrounds the body portion 34 of each of the testing probes 30.

The body portion 34 preferably substantially blocks the light through the corresponding light passage 26 when a low pin condition is present as illustrated in FIG. 3. If any of the testing probes 30 is not fully pushed back into the housing 20 by the corresponding terminal of the electrical connector 12 being tested, the body portion 34 of that testing probe blocks the light from passing from the light emitter 50 to the light receiver 60 as illustrated in FIG. 3 of the drawings. The body portion 34 is preferably comprised of a circular cross section, however other cross sectional shapes may be utilized (e.g. square, rectangular, oval, triangular).

The cutout 36 is preferably aligned with the corresponding light passage 26 when a terminal is properly seated within an electrical connector 12 being tested as illustrated in FIG. 4 of the drawings. The cutout 36 allows for the passage of at least a portion of the light from the light emitter 50 through the light passage 26 to the light receiver 60.

The bias member 40 is positioned within each of the probe passages 24 for biasing the testing probes 30 forwardly towards the receiver opening 22 as shown in FIGS. 2, 3, 4 and 9 of the drawings. The bias member 40 is preferably comprised of a compression spring positioned between an end of the body portion 34 and an end wall of the probe passage 24 as shown in FIGS. 2, 3, 4 and 9, however other biasing structures may be utilized. The bias member 40 preferably provides a sufficient force (e.g. 2 pounds) to the testing probe and thereafter upon the terminal of the connector 12 so as to dislodge any terminal capable of entering into a "low pin" condition as shown in FIG. 3 of the drawings.

The testing probes 30 preferably substantially block light from passing through the corresponding light passage 26 when a "low pin" condition is present in the corresponding row of terminals 14. The testing probes 30 preferably substantially allow light to pass through the corresponding light passage 26 when a "low pin" condition is not present in the corresponding row of terminals 14.

FIG. 13 illustrates an alternative embodiment of the present invention illustrating where the testing probes 30 block the light when the terminals 14 are properly seated within the connector 12. The body portion 34 of the testing probes 30 block the light when the terminals 14 are properly aligned. As illustrated in FIG. 13 of the drawings, the body portions 34 of the testing probes 30 are staggered so as to not interfere with one another. It is preferable that on each side of the body portions 34 that the cutouts 36 are positioned as shown in FIG. 13 of the drawings. More than one light emitter 50 and more than one light receiver 60 may be used for each row of testing probes 30.

F. Side Supports

Figure 7:
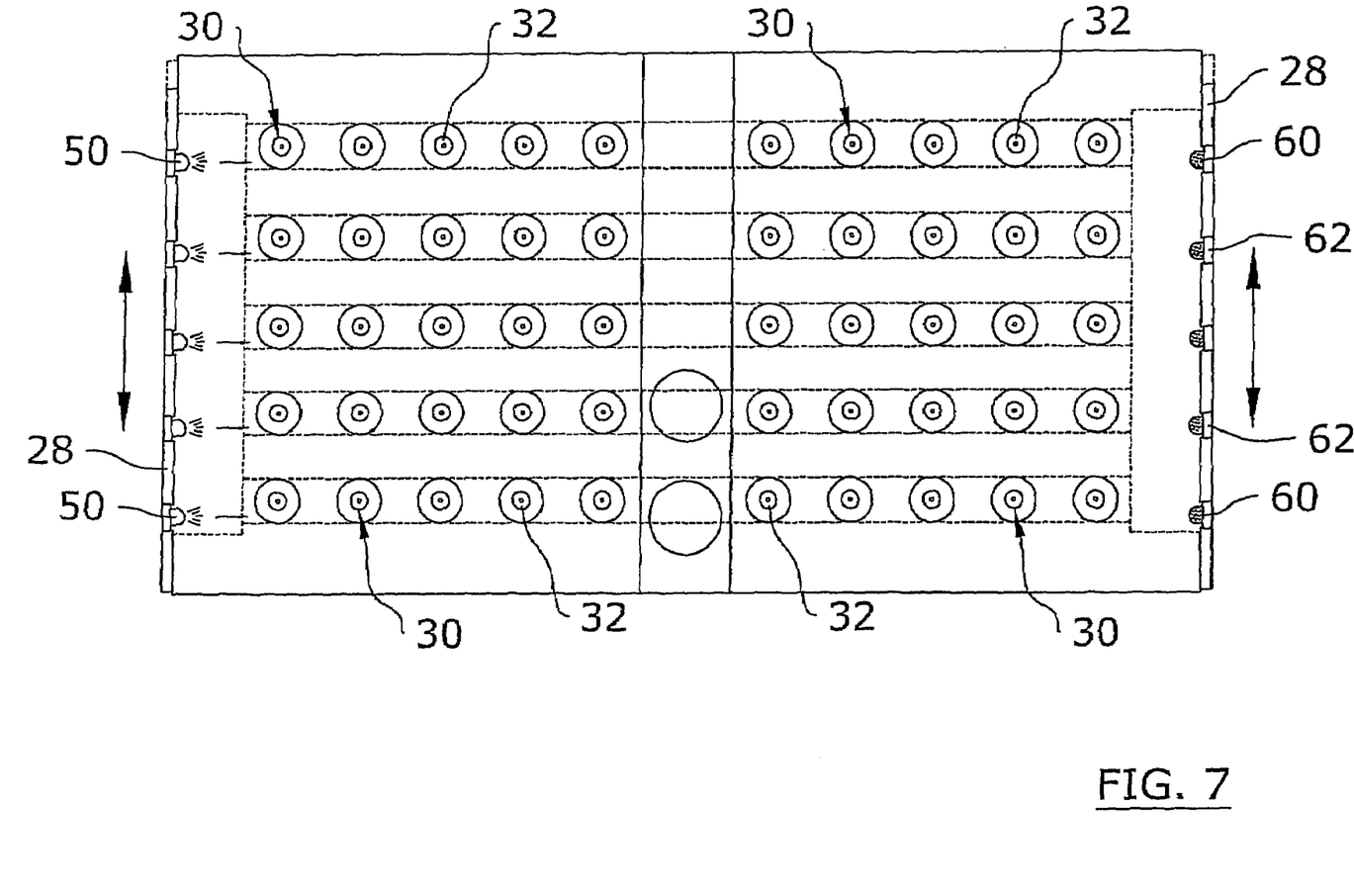
FIG. 7 is a front view of the present invention illustrating the side supports positioned in a lower position.
Figure 8:
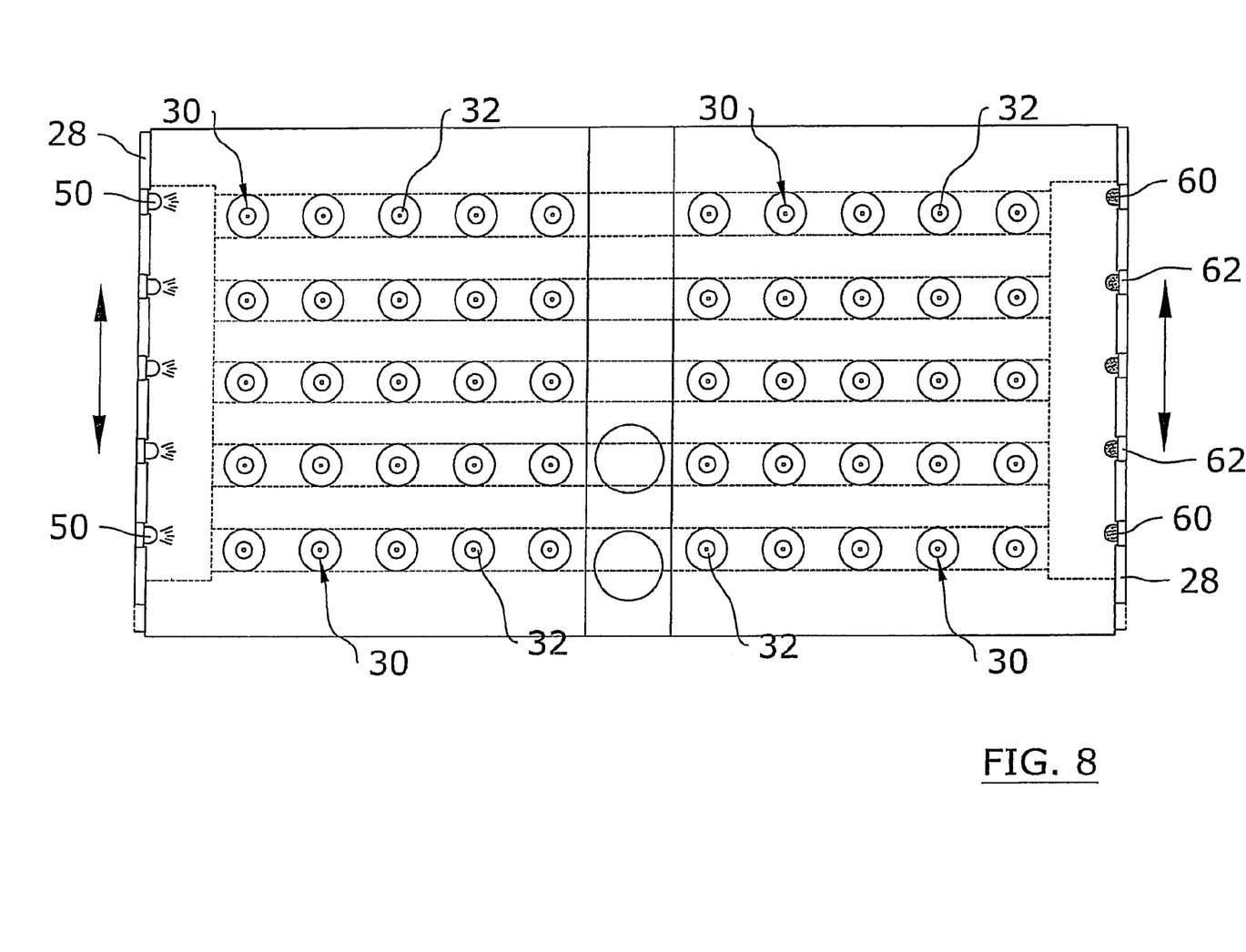
FIG. 8 is a front view of the present invention illustrating the side supports positioned in an upper position.
Figure 9:
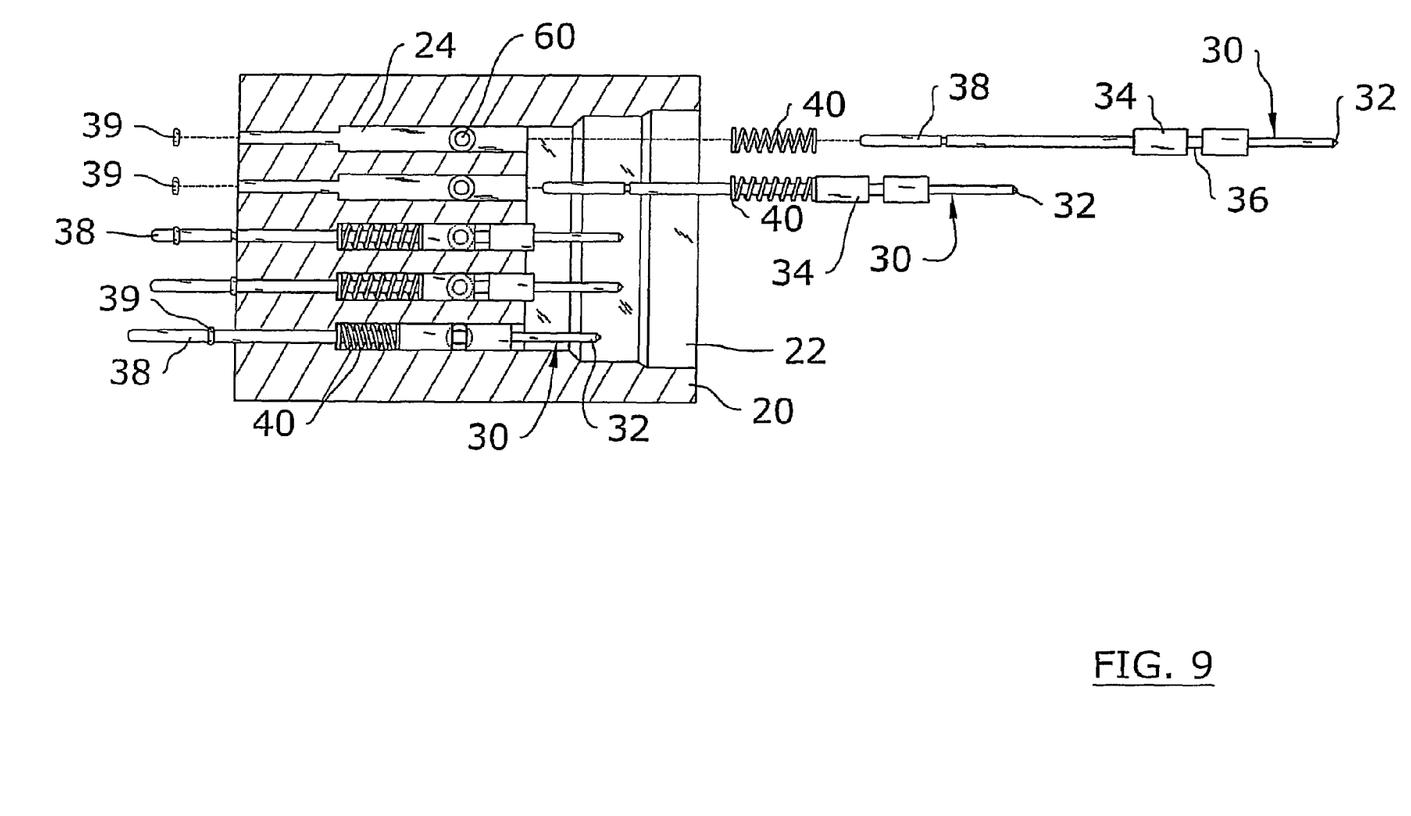
FIG. 9 is an exploded top cutaway view of the present invention.
Figure 10:
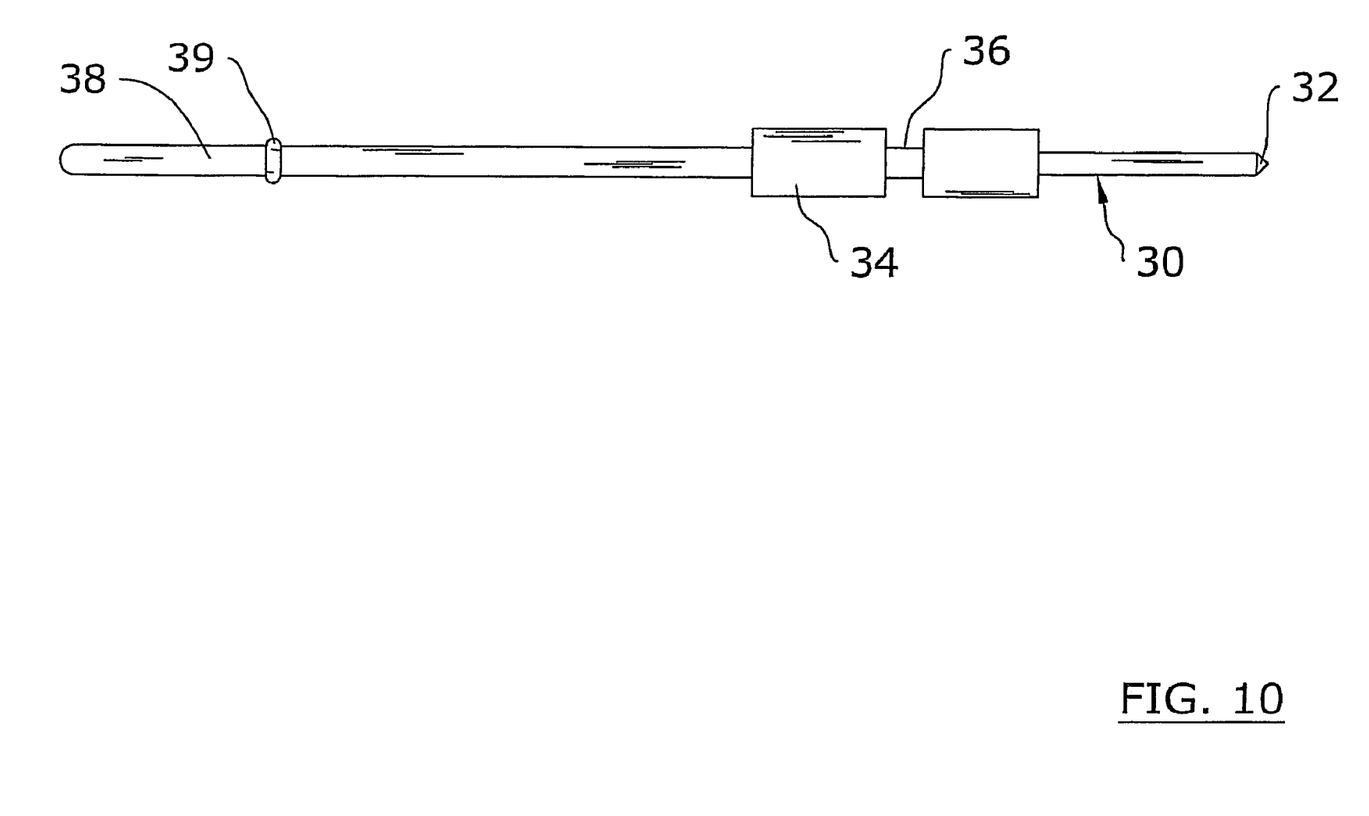
FIG. 10 is a side view of a testing probe.

FIGS. 1 through 4 illustrate the plurality of side supports 28 adjustably attached to the housing 20. Each light emitter 50 is attached to one of the side supports 28 as shown in FIGS. 2 through 4 of the drawings. Each light receiver 60 is attached to one of the side supports 28 opposite of the light emitter 50 as further shown in FIGS. 2 through 4. The side supports 28 are adjustably attached to the housing 20 using conventional fasteners. The user may adjust the position of the side supports 28 to align light emitters 50 and the light receivers 60 in various positions with respect to the testing probes 30 as shown in FIGS. 7 and 8 of the drawings.

G. Control Unit

Figure 11:
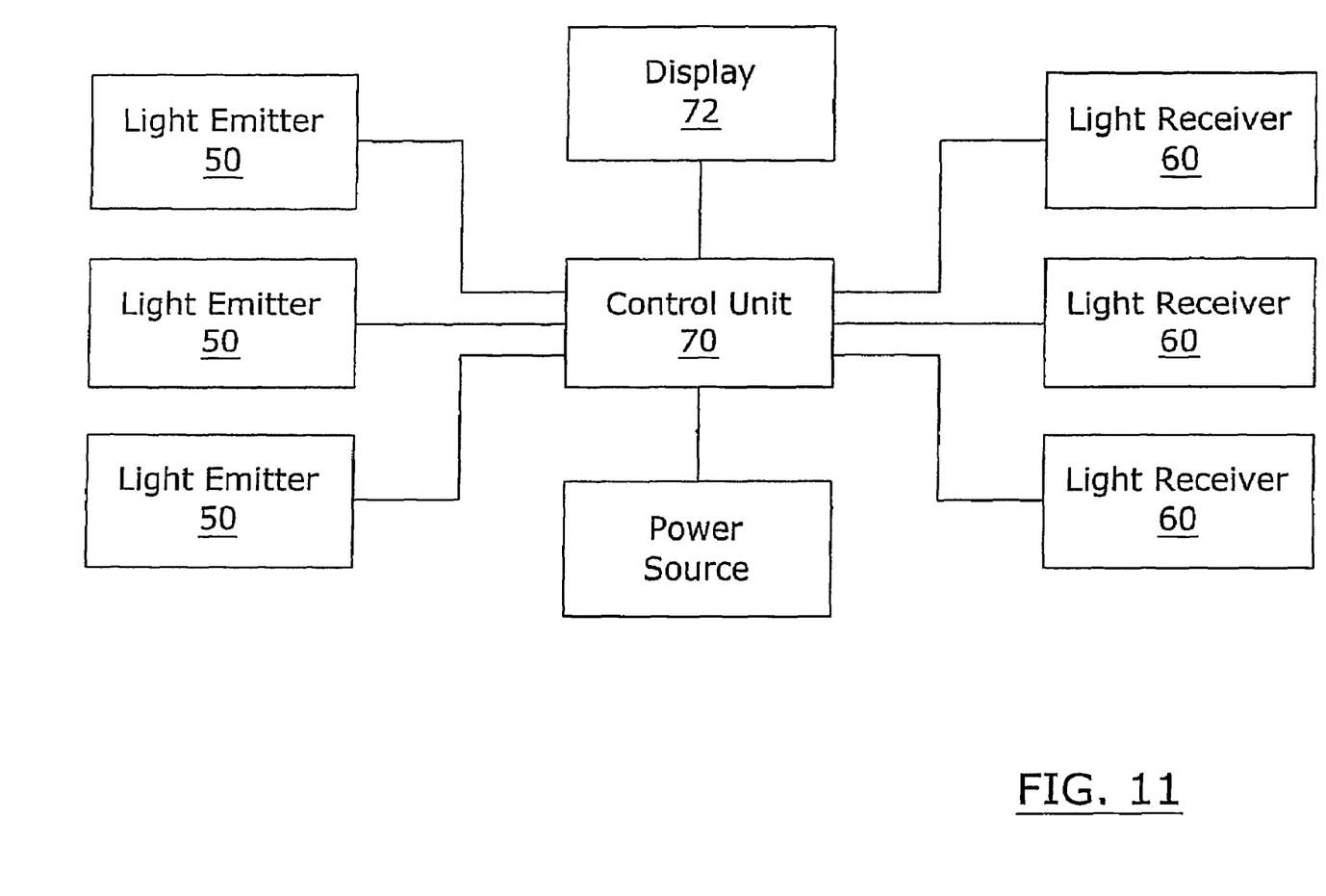
FIG. 11 is a block diagram of the control unit in communication with the light emitters and light receivers.
Figure 12A:
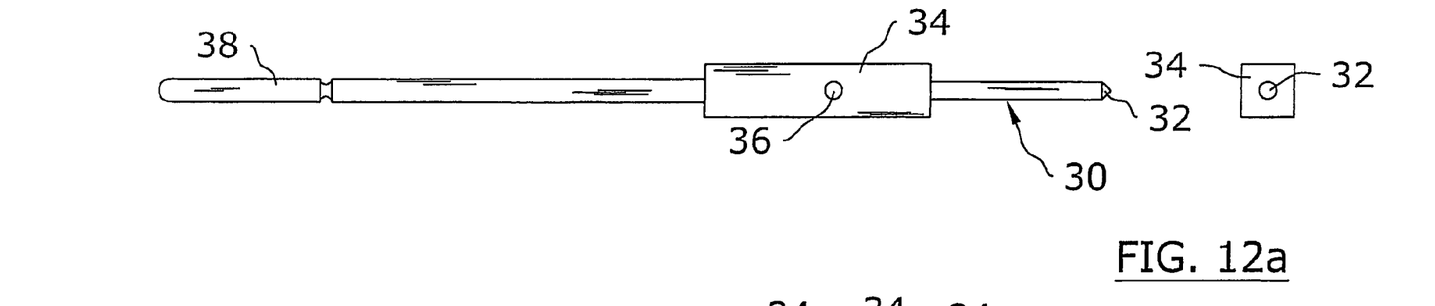
FIG. 12a illustrates a first alternative embodiment of the testing probe.
Figure 12B:
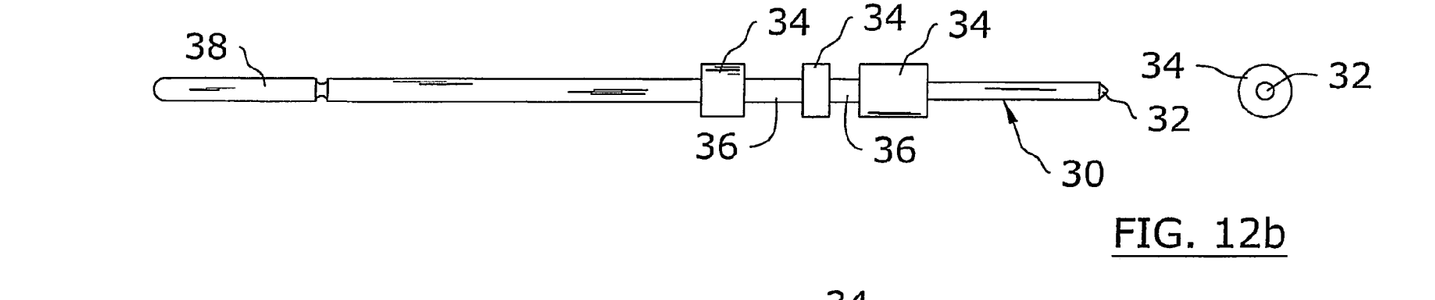
FIG. 12b illustrates a second alternative embodiment of the testing probe.
Figure 12C:
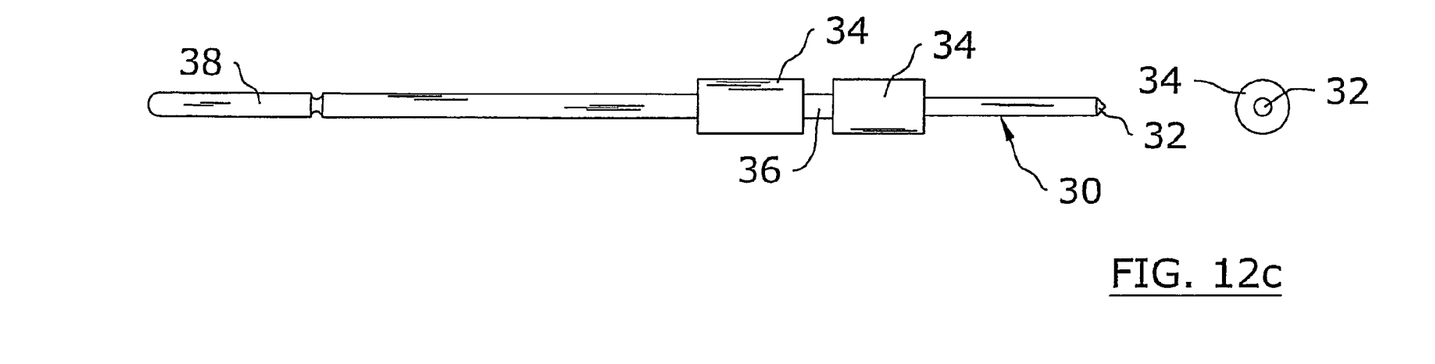
FIG. 12c illustrates a third alternative embodiment of the testing probe.

The control unit may be comprised of any electronic device such as but not limited to a computer. As shown in FIG. 11 of the drawings, the control unit 70 is preferably in communication with the light receivers 60 for indicating when a low pin condition is present within an electrical connector 12 being tested. The control unit 70 is further preferably in communication with the light emitters 50 for allowing control of the light emitters 50. The control unit 70 is connected or connectable to a conventional power source as further shown in FIG. 11. The control unit 70 preferably is in communication with a display 72 (e.g. LEDs, LCD) that indicates when a "low pin" condition exists and in what row of terminals 14 upon the connector 12 the "low pin" condition exits.

H. Operation of Invention

In operation, the user first positions the electrical connector 12 within a receiver opening 22 of a testing unit as shown in FIGS. 2 through 4 of the drawings. As the electrical connector 12 is positioned within the receiver opening 22, the engaging end 32 of the testing probes 30 extends through the receiver passage 16 and then engages the corresponding terminal 14 of the connector 12 thereby applying a force in an attempt to dislodge any terminal 14 capable of entering into a "low pin" condition as shown in FIGS. 2 through 4 of the drawings. If the terminal 14 is not dislodged and retains its position, then the testing probe 30 is forced rearwardly as shown in FIG. 4 of the drawings. If the terminal 14 is dislodged (i.e. "low pin" state), then the testing probe 30 is allowed to retain substantially its original position as shown in FIG. 3 of the drawings.

The control unit 70 may activate the light emitters 50 before, during or after the insertion of the electrical connector 12 within the receiver opening 22. The light emitters 50 illuminate from a first end of the corresponding light passages 26 towards the second end of the light passages 26. The light receivers 60 each detect whether or not the light from the corresponding light emitter 50 has passed through the light passage 26.

If the light has passed through the light passage 26 and impinges upon the corresponding light receiver 60, this indicates that there is no "low pin" condition in that row of terminals 14. FIG. 4 illustrates a row of terminals 14 that do not contain a "low pin" condition. The light receiver 60 either directly visually communicates the lack of a "low pin" condition in that row or indirectly communicates the same to the control unit 70 which is then visually (or audibly) communicated to the user via a display 72.

If the light does not pass through the light passage 26 to the corresponding light receiver 60, this indicates that there is a "low pin" condition in that row of terminals 14. In other words, one or more of the terminals 14 in the electrical connector 12 are loose and are in a "low pin" condition. FIG. 3 illustrates a row of terminals 14 that contain two terminals 14 in a "low pin" condition. The light receiver 60 either directly visually communicates the existence of a "low pin" condition in that row or indirectly communicates the same to the control unit 70 which is then visually (or audibly) communicated to the user via a display 72. Alternatively, the testing probes 30 can block the light when the terminals 14 are properly seated within the connector 12 and allow the light to pass through when there is a "low pin" condition as shown in FIG. 13 of the drawings.

After testing is completed, the electrical connector 12 is then removed from the receiver opening 22 so that the process may be repeated with another electrical connector 12.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims (and their equivalents) in which all terms are meant in their broadest reasonable sense unless otherwise indicated. Any headings utilized within the description are for convenience only and have no legal or limiting effect.

We claim:

1. A low pin testing system, comprising:
   a housing including at least one receiver opening for removably receiving at least one electrical connector with a plurality of terminals to be tested;
   a plurality of probe passages extending within said housing and into said at least one receiver opening;
   wherein said probe passages are substantially concentrically aligned with a plurality of terminals of at least one electrical connector to be tested;
   at least one light passage extending within said housing and corresponding to at least one row of said probe passages;
   at least one light emitter for providing light through said at least one light passage;
   at least one light receiver for detecting light from said at least one light emitter that passes through said at least one light passage;
   a plurality of testing probes slidably positioned within said plurality of probe passages of said housing in a biased manner towards said at least one receiver opening, wherein each of said testing probes includes an engaging end extending into said receiver opening and for engaging a terminal within said electrical connector; and
   wherein said testing probes substantially block light from passing through said at least one light passage when a low pin condition is present and wherein said testing probes substantially allow light to pass through said at least one light passage when a low pin condition is not present.

2. The low pin testing system of claim 1, wherein said at least one light passage extends through said at least one row of said probe passages.

3. The low pin testing system of claim 1, wherein said at least one light passage extends substantially transversely through said at least one row of said probe passages.

4. The low pin testing system of claim 1, wherein said at least one light passage extends substantially transversely with respect to said at least one row of said probe passages.

5. The low pin testing system of claim 1, wherein said testing probes each include a body portion and at least one cutout within said body portion, wherein said body portion substantially blocks the light through said at least one light passage when a low pin condition is present and wherein said at least one cutout is aligned with said at least one light passage when a terminal is properly seated within an electrical connector being tested.

6. The low pin testing system of claim 5, wherein said at least one cutout is comprised of a groove substantially surrounding said testing probes.

7. The low pin testing system of claim 5, wherein said body portion is comprised of a circular cross section.

8. The low pin testing system of claim 5, including a bias member positioned within each of said probe passages for biasing said testing probes forwardly towards said receiver opening.

9. The low pin testing system of claim 1, wherein each of said testing probes includes an end portion with a cincture for limiting a forward movement of said testing probes.

10. The low pin testing system of claim 1, wherein said testing probes are comprised of a substantially elongated straight structure.

11. The low pin testing system of claim 1, wherein said at least one light receiver includes an indicator for indicating detection of light from said at least one light emitter.

12. The low pin testing system of claim 1, including a plurality of side supports adjustably attached to said housing, wherein said at least one light emitter is attached to one of said side supports and wherein said at least one light receiver is attached to one of said side supports.

13. The low pin testing system of claim 1, including a control unit in communication with said at least one light receiver for indicating when a low pin condition is present within an electrical connector being tested.

14. A low pin testing system, comprising:
   a housing including at least one receiver opening for removably receiving at least one electrical connector with a plurality of terminals to be tested;
   a plurality of probe passages extending within said housing and into said at least one receiver opening;
   wherein said probe passages are substantially concentrically aligned with a plurality of terminals of at least one electrical connector to be tested;
   at least one light passage extending within said housing and corresponding to at least one row of said probe passages;

at least one light emitter for providing light through said at least one light passage;

at least one light receiver for detecting light from said at least one light emitter that passes through said at least one light passage;

a plurality of testing probes slidably positioned within said plurality of probe passages of said housing in a biased manner towards said at least one receiver opening, wherein each of said testing probes includes an engaging end extending into said receiver opening and for engaging a terminal within said electrical connector;

wherein said testing probes substantially block light from passing through said at least one light passage when a low pin condition is present and wherein said testing probes substantially allow light to pass through said at least one light passage when a low pin condition is not present;

wherein said at least one light passage extends substantially transversely through said at least one row of said probe passages;

wherein said testing probes each include a body portion and at least one cutout within said body portion, wherein said body portion substantially blocks the light through said at least one light passage when a low pin condition is present and wherein said at least one cutout is aligned with said at least one light passage when a terminal is properly seated within an electrical connector being tested;

wherein said at least one cutout is comprised of a groove substantially surrounding said testing probes; and a bias member positioned within each of said probe passages for biasing said testing probes forwardly towards said receiver opening.

15. The low pin testing system of claim 14, wherein said body portion is comprised of a circular cross section.

16. The low pin testing system of claim 14, wherein said testing probes are comprised of a substantially elongated straight structure and includes an end portion with a cincture for limiting a forward movement of said testing probes.

17. The low pin testing system of claim 14, wherein said at least one light receiver includes an indicator for indicating detection of light from said at least one light emitter.

18. The low pin testing system of claim 14, including a plurality of side supports adjustably attached to said housing, wherein said at least one light emitter is attached to one of said side supports and wherein said at least one light receiver is attached to one of said side supports.

19. The low pin testing system of claim 14, including a control unit in communication with said at least one light receiver for indicating when a low pin condition is present within an electrical connector being tested.

20. A method of testing an electrical connector for a low pin condition, said method comprising the steps of:

positioning an electrical connector having a plurality of terminals within a receiver opening of a testing unit, wherein said testing unit has a plurality of testing probes that are biased and that engage said plurality of terminals within said electrical connector when said electrical connector is positioned within said receiver opening, and wherein said testing probes have a cutout within a body portion;

illuminating a first end of at least one light passage within said testing unit, wherein said at least one light passage is blocked by said body portion of said testing probes and wherein said cutout allows light to pass by said testing probes; and detecting if light has passed through said light passage after said positioning of said electrical connector within said receiver opening to determine if a low pin condition is present.

21. A low pin testing system, comprising:

a housing including at least one receiver opening for removably receiving at least one electrical connector with a plurality of terminals to be tested;

a plurality of probe passages extending within said housing and into said at least one receiver opening;

wherein said probe passages are substantially concentrically aligned with a plurality of terminals of at least one electrical connector to be tested;

at least one light passage extending within said housing and corresponding to at least one row of said probe passages;

at least one light emitter for providing light through said at least one light passage;

at least one light receiver for detecting light from said at least one light emitter that passes through said at least one light passage;

a plurality of testing probes slidably positioned within said plurality of probe passages of said housing in a biased manner towards said at least one receiver opening, wherein each of said testing probes includes an engaging end extending into said receiver opening and for engaging a terminal within said electrical connector; and wherein said testing probes substantially allow light to pass through said at least one light passage when a low pin condition is present and wherein said testing probes substantially block light from passing through said at least one light passage when a low pin condition is not present.

22. The low pin testing system of claim 21, wherein said at least one light passage extends through said at least one row of said probe passages.

23. The low pin testing system of claim 21, wherein said at least one light passage extends substantially transversely through said at least one row of said probe passages.

24. The low pin testing system of claim 21, wherein said at least one light passage extends substantially transversely with respect to said at least one row of said probe passages.

25. The low pin testing system of claim 21, wherein said testing probes each include a body portion and at least one cutout within said body portion, wherein said body portion substantially blocks the light through said at least one light passage when a low pin condition is not present and wherein said at least one cutout is aligned with said at least one light passage when a terminal is not properly seated within an electrical connector being tested.

26. The low pin testing system of claim 25, wherein said at least one cutout is comprised of a groove substantially surrounding said testing probes.

27. The low pin testing system of claim 25, wherein said body portion is comprised of a circular cross section.

28. The low pin testing system of claim 25, including a bias member positioned within each of said probe passages for biasing said testing probes forwardly towards said receiver opening.

29. The low pin testing system of claim 21, wherein each of said testing probes includes an end portion with a cincture for limiting a forward movement of said testing probes.

30. The low pin testing system of claim 21, wherein said testing probes are comprised of a substantially elongated straight structure.

31. The low pin testing system of claim 21, wherein said at least one light receiver includes an indicator for indicating detection of light from said at least one light emitter.

32. The low pin testing system of claim 21, including a plurality of side supports adjustably attached to said housing, wherein said at least one light emitter is attached to one of said side supports and wherein said at least one light receiver is attached to one of said side supports.

33. The low pin testing system of claim 21, including a control unit in communication with said at least one light receiver for indicating when a low pin condition is present within an electrical connector being tested.

* * * * *